United States Patent
Yeh et al.

(10) Patent No.: US 9,780,217 B2
(45) Date of Patent: Oct. 3, 2017

(54) NON-PLANAR SEMICONDUCTOR DEVICE HAVING SELF-ALIGNED FIN WITH TOP BLOCKING LAYER

(71) Applicant: Intel Corporation, Santa Clara, CA (US)

(72) Inventors: Jeng-Ya D. Yeh, Portland, OR (US); Chia-Hong Jan, Portland, OR (US); Walid M. Hafez, Portland, OR (US); Joodong Park, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/780,218

(22) PCT Filed: Jun. 26, 2013

(86) PCT No.: PCT/US2013/047757
§ 371 (c)(1),
(2) Date: Sep. 25, 2015

(87) PCT Pub. No.: WO2014/209289
PCT Pub. Date: Dec. 31, 2014

(65) Prior Publication Data
US 2016/0056293 A1 Feb. 25, 2016

(51) Int. Cl.
*H01L 29/78* (2006.01)
*H01L 29/66* (2006.01)
*H01L 29/423* (2006.01)

(52) U.S. Cl.
CPC .... *H01L 29/7851* (2013.01); *H01L 29/42368* (2013.01); *H01L 29/66795* (2013.01); *H01L 29/785* (2013.01)

(58) Field of Classification Search
CPC ........... H01L 29/7851; H01L 29/42368; H01L 29/66795; H01L 29/785; H01L 29/66803;
(Continued)

(56) References Cited

U.S. PATENT DOCUMENTS 5,895,945 A * 4/1999 Pan .................. H01L 27/11558
257/300
6,208,549 B1 3/2001 Rao et al.
(Continued)

FOREIGN PATENT DOCUMENTS

JP 2002237524 8/2002
KR 10-2013-0040686 4/2013
(Continued)

OTHER PUBLICATIONS

Office Action for Taiwan Patent Application No. 103121561, dated Sep. 3, 2015, 8 pages.
(Continued)

*Primary Examiner* — Bo Fan
(74) *Attorney, Agent, or Firm* — Schwabe, Williamson & Wyatt P.C.

(57) ABSTRACT

Non-planar semiconductor devices having self-aligned fins with top blocking layers and methods of fabricating non-planar semiconductor devices having self-aligned fins with top blocking layers are described. For example, a semiconductor structure includes a semiconductor fin disposed above a semiconductor substrate and having a top surface. An isolation layer is disposed on either side of the semiconductor fin, and recessed below the top surface of the semiconductor fin to provide a protruding portion of the semiconductor fin. The protruding portion has sidewalls and the top surface. A gate blocking layer has a first portion disposed on at least a portion of the top surface of the semiconductor fin, and has a second portion disposed on at least a portion of the sidewalls of the semiconductor fin. The first portion of the gate blocking layer is continuous with, but thicker than, the second portion of the gate blocking layer. A gate stack is disposed on the first and second portions of the gate blocking layer.

22 Claims, 7 Drawing Sheets

(58) Field of Classification Search
CPC .......... H01L 2029/7858; H01L 29/512; H01L 27/0924; H01L 29/7856
USPC .......... 257/411, 311, 384, 506; 438/283, 384
See application file for complete search history.

(56) References Cited

U.S. PATENT DOCUMENTS

| | | | |
|---|---|---|---|
| 6,885,055 B2* | 4/2005 | Lee .............................. | 257/308 |
| 2007/0111403 A1 | 5/2007 | Jiang et al. | |
| 2008/0157201 A1 | 7/2008 | Marshall | |
| 2009/0243032 A1 | 10/2009 | Chen | |
| 2009/0283840 A1 | 11/2009 | Coolbaugh et al. | |
| 2010/0276761 A1* | 11/2010 | Tung ................. | H01L 29/41791 257/384 |
| 2012/0168895 A1* | 7/2012 | Yin ................... | H01L 21/02238 257/506 |
| 2012/0217612 A1* | 8/2012 | Baars ................. | H01L 29/7841 257/508 |
| 2013/0009246 A1* | 1/2013 | Cheng ................. | H01L 29/785 257/350 |
| 2013/0045580 A1* | 2/2013 | Cho ................ | H01L 21/823431 438/296 |

FOREIGN PATENT DOCUMENTS

| | | |
|---|---|---|
| TW | 200810109 | 2/2008 |
| WO | WO-20070122567 | 11/2007 |

OTHER PUBLICATIONS

International Preliminary Report on Patentability for PCT/US2013/047757, issued Dec. 29, 2015, 6 pages.
International Search Report and Written Opinion of the International Searching Authority dated Mar. 31, 2014, in International Patent Application No. PCT/US2013/047757, 10 pages.
International Search Report and Written Opinion for PCT Patent Application No. PCT/US2013/047626 mailed Apr. 18, 2014, 11 pgs.

* cited by examiner

US 9,780,217 B2

NON-PLANAR SEMICONDUCTOR DEVICE HAVING SELF-ALIGNED FIN WITH TOP BLOCKING LAYER

CLAIM OF PRIORITY

This application is a U.S. National Phase application under 35 U.S.C. §371 of International Application No. PCT/US13/47757, filed Jun. 26, 2013, entitled "NON-PLANAR SEMICONDUCTOR DEVICE HAVING SELF-ALIGNED FIN WITH TOP BLOCKING LAYER," the entire contents of which are incorporated herein by reference.

TECHNICAL FIELD

Embodiments of the invention are in the field of semiconductor devices and processing and, in particular, non-planar semiconductor devices having self-aligned fins with top blocking layers and methods of fabricating non-planar semiconductor devices having self-aligned fins with top blocking layers.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

In the manufacture of integrated circuit devices, multi-gate transistors, such as fin field effect transistors (fin-FETs), have become more prevalent as device dimensions continue to scale down. In conventional processes, fin-FETs are generally fabricated on either bulk silicon substrates or silicon-on-insulator substrates. In some instances, bulk silicon substrates are preferred due to their lower cost and compatibility with the existing high-yielding bulk silicon substrate infrastructure.

Scaling multi-gate transistors has not been without consequence, however. As the dimensions of these fundamental building blocks of microelectronic circuitry are reduced and as the sheer number of fundamental building blocks fabricated in a given region is increased, the constraints on the semiconductor processes used to fabricate these building blocks have become overwhelming.

BRIEF DESCRIPTION OF THE DRAWINGS

FIG. 2A illustrates a bulk substrate patterned to have fins 202 protruding there from;

FIG. 2B illustrates an implant process performed on the exposed the top surface of each of the fins of the structure of FIG. 2A;

FIG. 2C illustrates recessing of a dielectric layer of the structure of FIG. 2B below the top surfaces of the fins to provide an isolation layer with protruding portions of the fins there above;

FIG. 2D illustrates thermal oxidation of the exposed portions of the fins of FIG. 2C to form a fin dielectric layer on all surfaces of the exposed portions of the fins;

FIG. 2E illustrates a gate forming layer formed over the structure of FIG. 2D;

FIG. 2F illustrates planarization of the gate forming layer of the structure of FIG. 2E to provide a planar gate forming layer above the structure of FIG. 2D;

FIG. 2G illustrates formation of a hardmask above the structure of FIG. 2F; and

FIG. 2H illustrates patterning of the hardmask and planar gate forming layer of FIG. 2G to a desired gate geometry to form a patterned hardmask and patterned gate forming layer above the fins and fin dielectric layer of FIG. 2D.

DESCRIPTION OF THE EMBODIMENTS

Non-planar semiconductor devices having self-aligned fins with top blocking layers and methods of fabricating non-planar semiconductor devices having self-aligned fins with top blocking layers are described. In the following description, numerous specific details are set forth, such as specific integration and material regimes, in order to provide a thorough understanding of embodiments of the present invention. It will be apparent to one skilled in the art that embodiments of the present invention may be practiced without these specific details. In other instances, well-known features, such as integrated circuit design layouts, are not described in detail in order to not unnecessarily obscure embodiments of the present invention. Furthermore, it is to be understood that the various embodiments shown in the Figures are illustrative representations and are not necessarily drawn to scale.

One or more embodiments described herein are directed to new approaches for self-aligned fin-FET device fabrication. The fin-FETs include a top blocking layer to mitigate or entirely eliminate any top gate control. However, in other embodiments, tri-gate devices may be fabricated where a measurable amount of gate control is achieved from a portion of a gate electrode above the top surface of the fin. One or more embodiments may include one or more of complimentary metal oxide semiconductor (CMOS) fin-FET device fabrication, implantation processes.

To provide context, conventional approaches for fin-FET fabrication utilize a patterned hardmask, the pattern of which is transferred to silicon during an etch process for fin fabrication. The dielectric hardmask material layer is eroded greatly during the isolation polish process and its thickness is subject to the polish process variation. However, the control of the hardmask thickness is critical for the transistor characteristics of the resulting fin-FET transistors. That is, the state of the art fin-FET technology relies heavily on process control to reduce the variation of fin top hardmask thickness. Other methods involving more complicated integration schemes have also been proposed by various research groups, however, manufacturability is often compromised. By contrast, one or more embodiments described herein utilize an implant process to enhance oxidation behavior to selectively induce thicker oxide growth on the fin top for isolation or blocking purposes.

Figure 1:
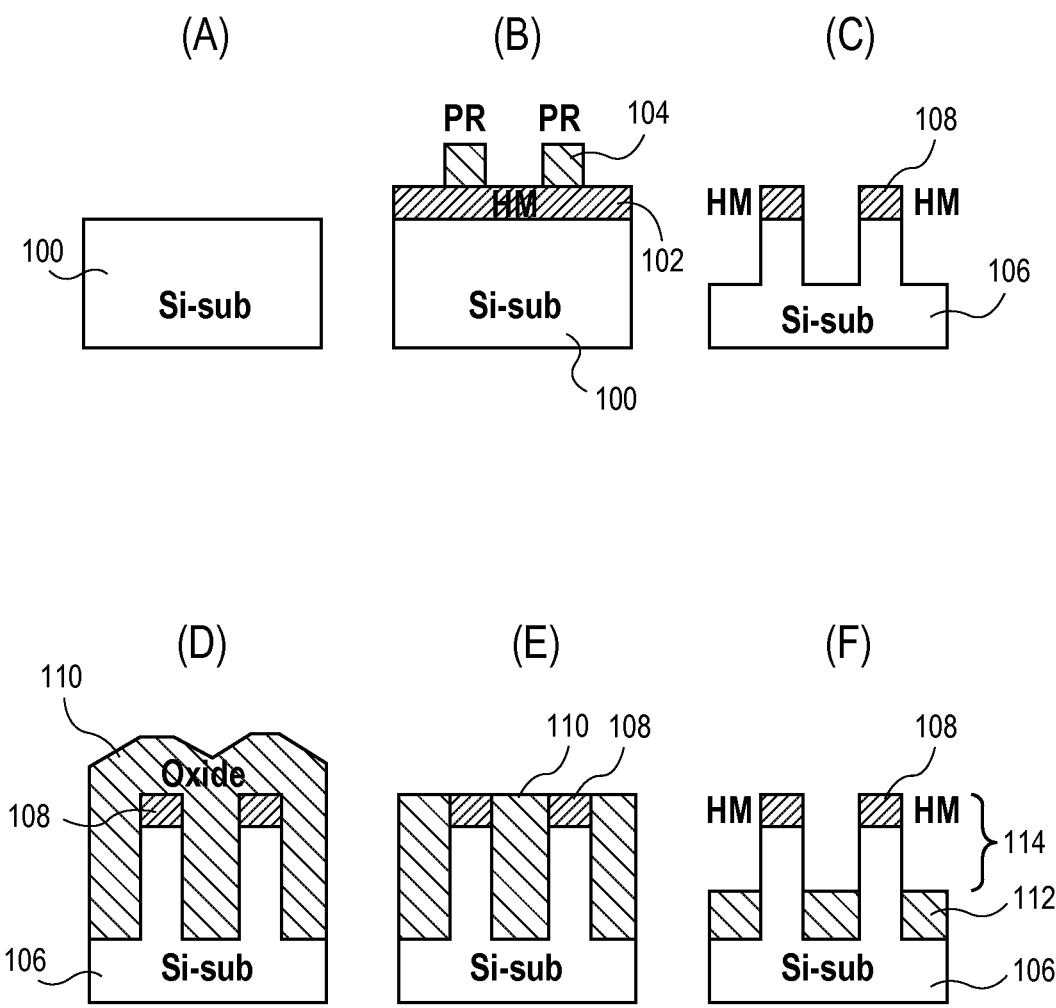
FIG. 1 illustrates various process operations in a conventional method of fabricating fins for a fin-FET device based on a bulk silicon substrate.

As an example of a prior approach, FIG. 1 illustrates various process operations in a conventional method of fabricating fins for a fin-FET device based on a bulk silicon substrate. Referring to part (A) of FIG. 1, a silicon substrate (Si-sub) 100 is provided. Referring to part (B), a hardmask (HM) 102 is formed on the silicon substrate 100, and a photoresist layer (PR) 104 is patterned on the hardmask 102. Referring to part (C), the hardmask 102 and silicon substrate 100 are patterned with the pattern of the photoresist 104, and the photoresist 104 is removed. A patterned silicon substrate 106 and patterned hardmask 108 are provided in this way. Referring to part (D), an oxide layer (oxide) 110 is formed over the structure of part (C). Referring to part (E), the oxide layer 110 is planarized to expose the patterned hardmask 108. Referring to part (F), the oxide layer 110 is recessed below the surface of the patterned hardmask 108 to expose sidewall portions of the patterned silicon substrate 106. The recessed oxide layer provides an isolation layer 112. The portions 114 of the patterned silicon substrate 106 and the patterned hardmask 108 that protrude above the isolation layer 112 provide fins for ultimate fabrication of a fin-FET device, where the patterned hardmask 108 is used as an upper blocking layer to prevent gate control from the top surface of the fin.

In contrast to the approach illustrated in FIG. 1, generally, one or more embodiments described herein provide approaches to achieve fin-FET transistors with a thick oxide isolation layer on the fin top, as formed by a self-aligned method. In an embodiment, the differential of the dielectric layer thickness at top and sidewall of the fin is enabled by such integration schemes.

More specifically, in an embodiment, the process flows described herein does not necessitate any additional lithography operations over conventional process flows, rather utilize lower cost additional implant and clean operations. In an embodiment, the process is self-aligned. Therefore, the resulting devices are not subject to additional lithography registration error and/or critical dimension (CD) variation. Additionally, the process is very stable and can be well controlled. In an embodiment, hardmask (HM) oxide thickness depends on the doping of the implant and oxidation processes, as described below in greater detail. Both processes have very tight process control with current Si technology. As a result, in one embodiment, the resulting transistor characteristics are more uniform.

Figure 2A:
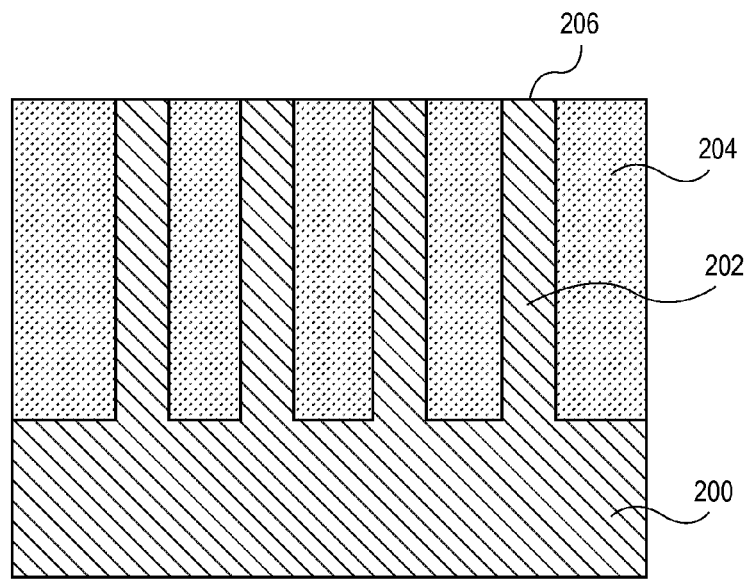
FIGS. 2A-2H illustrate cross-sectional view of various operations in a method of fabricating non-planar semiconductor devices having self-aligned fins with top blocking layers, in accordance with an embodiment of the present invention, where.

Referring to FIG. 2A, a bulk substrate 200, such as a bulk single crystalline substrate, is patterned to have fins 202 protruding there from. In one embodiment, the fins 202 are continuous with the bulk portion of the substrate 200 and, as such, are formed continuous with the bulk substrate 200, as depicted. A dielectric layer 204 is formed over the bulk substrate 200 and planarized to expose the top surface 206 of each of the fins 202.

In one embodiment, the illustration of FIG. 2A begins the process flow description post fin etch and shallow trench isolation (STI) polish following isolation oxide deposition. Referring again to FIG. 2A, artifacts that may have at one point remained from the fabrication of fins 202 have also been removed. For example, in one embodiment, a hardmask layer, such as a silicon nitride hardmask layer, and a pad oxide layer, such as a silicon dioxide layer, have been removed from remain the top surface 206 of fins 202. In one embodiment, the bulk substrate 200 and, hence, the fins 102, are undoped or lightly doped at this stage. For example, in a particular embodiment, the bulk substrate 200 and, hence, the fins 202, have a concentration of less than approximately 1E17 atoms/cm$^3$ of boron dopant impurity atoms. However, in other embodiments, well and/or retrograde implants have been, or will be, provided to the fins 202 and underlying substrate 202. In one such example, such doping of the exposed fins 202 may lead to doping within the bulk substrate portion 200, where adjacent fins 202 share a common doped region in the bulk substrate 200.

In an embodiment, referring again to FIG. 2A, the dielectric layer 204 is composed of silicon dioxide, such as is used in a shallow trench isolation fabrication process. The dielectric layer 204 may be deposited by a chemical vapor deposition (CVD) or other deposition process (e.g., ALD, PECVD, PVD, HDP assisted CVD, low temp CVD) and may be planarized by a chemical mechanical polishing (CMP) technique. The planarization may also removes any artifacts from fin patterning, such as a hardmask layer and/or pad oxide layer, as mentioned above.

Figure 2B:
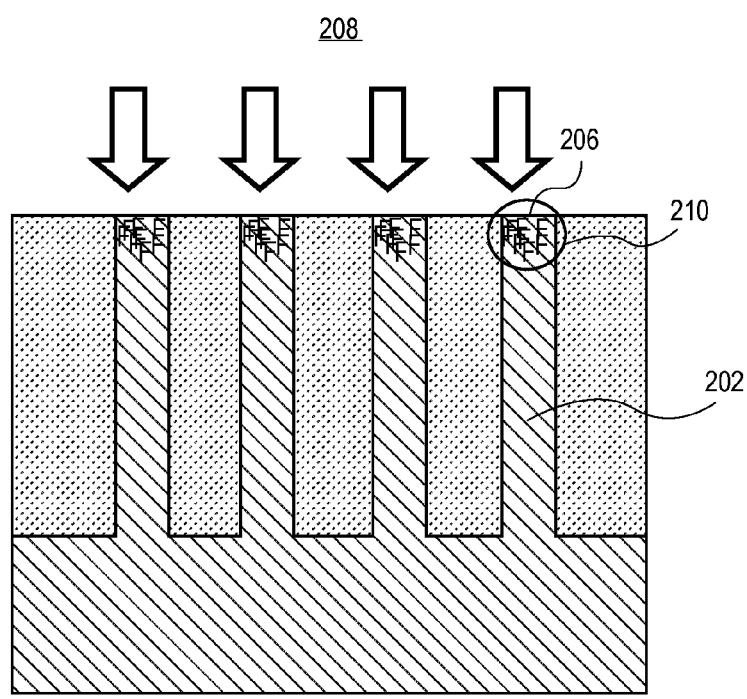

Referring to FIG. 2B, an implant process 208 is performed on the exposed the top surface 206 of each of the fins 202. The implant process provides implanted regions 210 in upper portion in each of fins 202. In an embodiment, the implant process 208 involves implanting an oxidation-enhancing dopant into the semiconductor fins 202 from the top surface 206 of the semiconductor fins 202. In one embodiment, implanting the oxidation-enhancing dopant into the semiconductor fins 202 involves implanting fluorine (F) atoms or argon (Ar) atoms, or both (in the example, shown, F atoms have been implanted). In an embodiment, the implant involves use of a low energy and high dose implant of the dopant. For example, in one embodiment, the implanting is performed with an energy approximately in the range of 1-15 keV and a dose approximately in the range of 1e14-1e16 atoms/cm$^2$. In an embodiment, the result is a highly Ar- or F-doped fin top while lower portions of the fin are not highly doped.

Figure 2C:
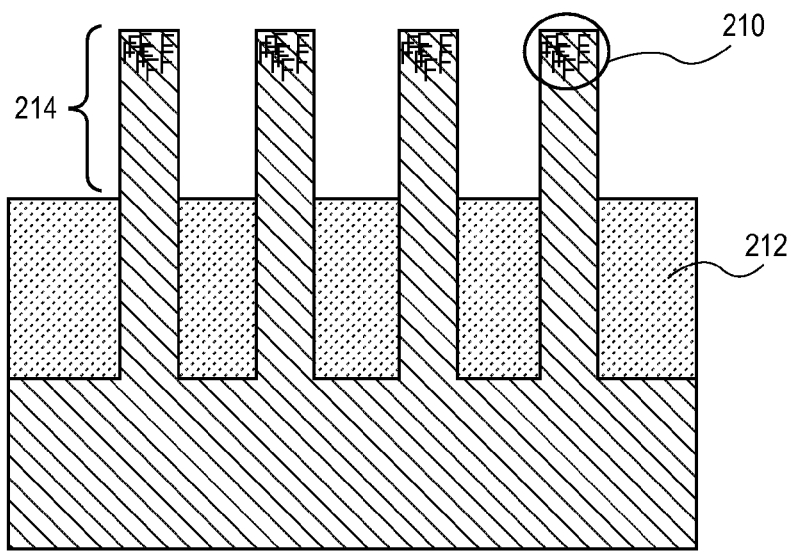

Referring to FIG. 2C, the dielectric layer 204 is recessed below the top surfaces 206 of the fins 202 to provide an isolation layer 212 with protruding portions 214 of the fins 202. In one embodiment, the recess leaves the top surface of the isolation layer 212 below regions 210, but without exposing the entirety of each fin 202, as is depicted in FIG. 2C.

In an embodiment, recessing of the dielectric layer 204 defines the Si channel height (HSI). The recessing may be performed by a plasma, vapor or wet etch process. In one embodiment, a dry etch process selective to silicon fins 202 is used, the dry etch process based on a plasma generated from gases such as, but not limited to $NF_3$, $CHF_3$, $C_4F_8$, HBr and $O_2$ with typically pressures in the range of 30-100 mTorr and a plasma bias of 50-1000 Watts.

Figure 2D:
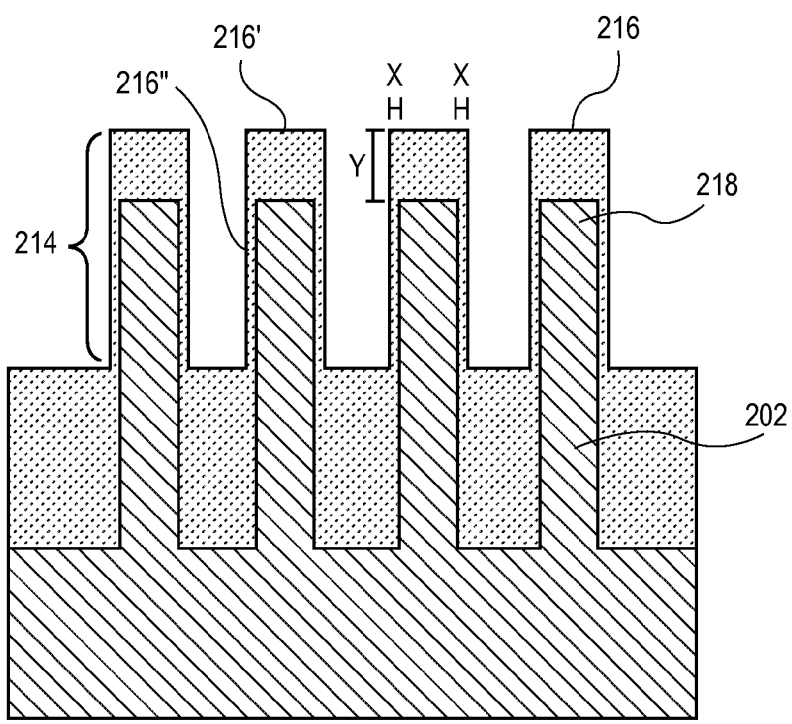

Referring to FIG. 2D, the exposed portions 214 of the fins 202 are thermally oxidized to form a fin dielectric layer 216 on all surfaces of the exposed portions 214 of the fins 202. In one embodiment, the fin dielectric layer 216 is composed of a material the same as or similar to the isolation layer 212, as is depicted. However, it is to be understood that these materials need not be similar in composition.

The fin dielectric layer may also be referred to as a blocking layer or gate blocking layer. In an embodiment, as depicted, the gate blocking layer 216 has a first portion 216' disposed on at least a portion of the top surface of the semiconductor fin 202 (i.e., on the top surface of the protruding portion 214 of the fins 202). A second portion 216" is disposed on at least a portion of the sidewalls of the semiconductor fin 202 (i.e., on the sidewalls of the protruding portion 214 of the fins 202). In one such embodiment, as is also depicted, the first portion of the gate blocking layer 216' is continuous with, but thicker than, the second portion 216" of the gate blocking layer (i.e., the thickness 'y' is greater than the thickness 'x'). In a specific such embodiment, the first portion of the gate blocking layer 216' has a thickness greater than the second portion of the gate blocking layer 216" by an amount approximately in the range of 10-50%.

In an embodiment, referring again to FIG. 2D, the protruding portions 214 of the semiconductor fins 202 further includes a region 218 of fluorine (F) atoms or argon (Ar) atoms, or both, at an uppermost portion, but not in the entirety of, the protruding portion of the semiconductor fin, e.g., as an artifact of the implant process described in association with FIG. 2B. In one such embodiment, the first portion of the gate blocking layer 216' is directly adjacent to the region 218 of F atoms or argon Ar atoms. In a specific such embodiment, the region 218 of F or argon Ar atoms has a concentration of F atoms or Ar atoms, or both approximately in the range of 1e19-1e21 atoms/cm$^3$.

In an embodiment, the gate blocking layer 216 (composed of 216' and 216") is composed of an oxide of the semiconductor material of the semiconductor fins 202. In one such embodiment, the semiconductor fins 202 are composed of single crystalline silicon, and the gate blocking layer 216 is composed of silicon dioxide, e.g., as a thermally grown silicon oxide.

Thus, referring again to FIG. 2D, in an embodiment, thermally oxidizing the protruding portions 214 of each of the semiconductor fins 202 forms a first portion 216' of a blocking dielectric layer on top of each of the protruding portions of the semiconductor fins and a second portion 216" of the blocking dielectric layer on sidewalls of each of the protruding portions of the semiconductor fins, the first portion 216' thicker than the second portion 216". In one such embodiment, thermally oxidizing the protruding portions 214 of each of the semiconductor fins 202 involves heating in the presence of oxygen at a temperature approximately in the range of 500-800 degrees Celsius. In an embodiment, the top portion 216' is sufficiently thick to mitigate or eliminate control of the fin from a portion of a subsequently formed gate electrode that is above the top portion 216', e.g., to enable fin-FET formation instead of trigate formation, as described in greater detail in association with FIGS. 3A and 3B. The greater relative thickness of 216' versus 216" is, in one embodiment, attributable to the implant described in association with FIG. 2B. In a specific such embodiment, the growth rate of the implanted portion (e.g., at the surface) is greater than the growth rate of the non-implanted portion (e.g., at the sidewalls) by a factor approximately in the range of 10-50%.

Figure 2E:
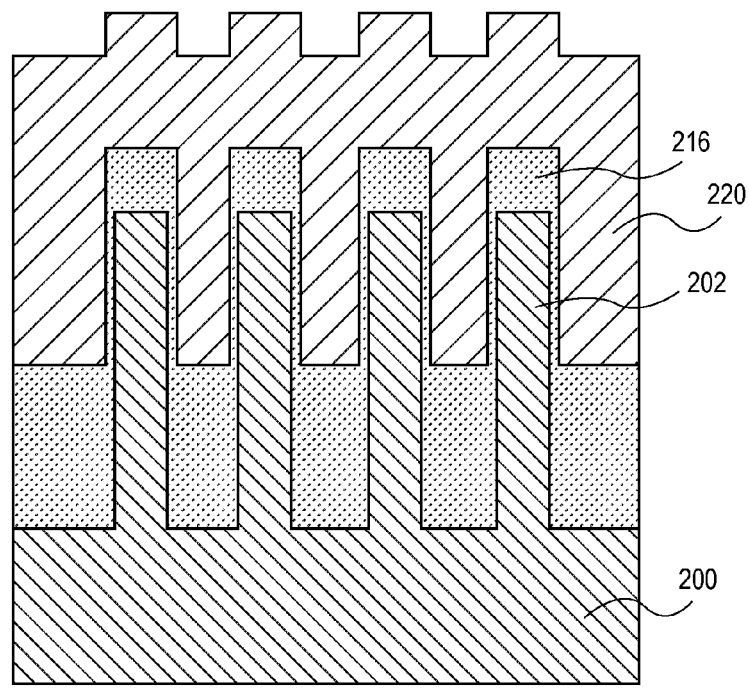

Referring to FIG. 2E, a gate forming layer 220 is formed over the structure of FIG. 2D. In an embodiment, gate forming layer 220 is a polycrystalline silicon layer formed by a chemical vapor deposition (CVD) process, e.g., in a furnace, or other deposition process (e.g., ALD, PECVD, PVD, HDP assisted CVD, low temp CVD) as a conformal layer above the entire structure of FIG. 2D.

Figure 2F:
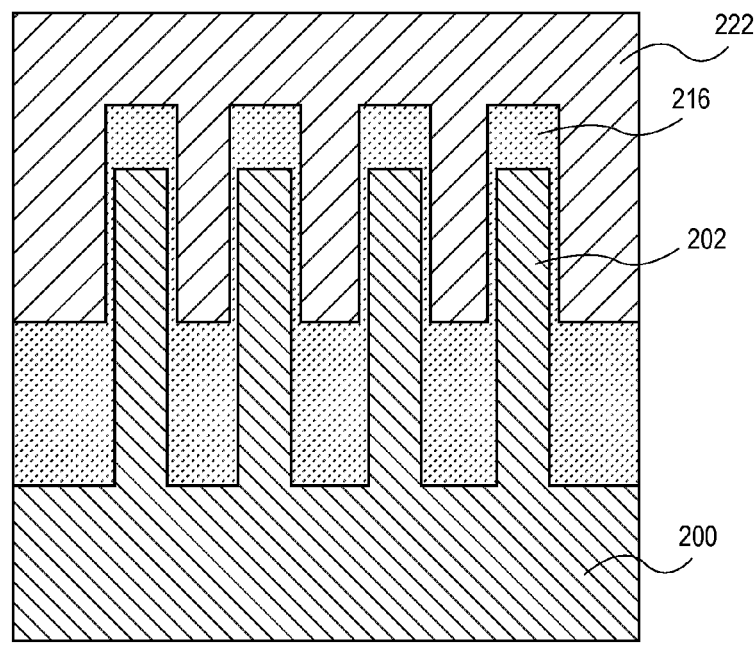

Referring to FIG. 2F, the gate forming layer 220 is planarized to provide a planar gate forming layer 222 (e.g., of flat or no topography) above the structure of FIG. 2D. In an embodiment, the gate forming layer 220 is planarized by a chemical mechanical polishing (CMP) technique. The planarization of the gate forming layer 220 can be important for a subsequent polysilicon lithography process.

Figure 2G:
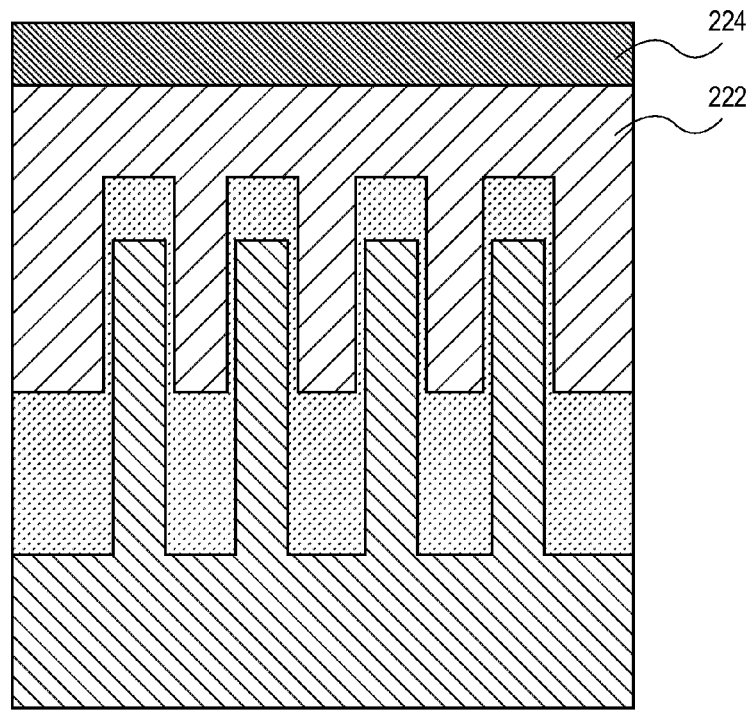

Referring to FIG. 2G, a hardmask 224 is formed above the structure of FIG. 2F. In an embodiment, the hardmask 224 is a silicon nitride (SiN) hardmask, e.g., deposited by a CVD process or other deposition process (e.g., ALD, PECVD, PVD, HDP assisted CVD, low temp CVD) as a conformal layer above the entire structure of FIG. 2F.

Figure 2H:
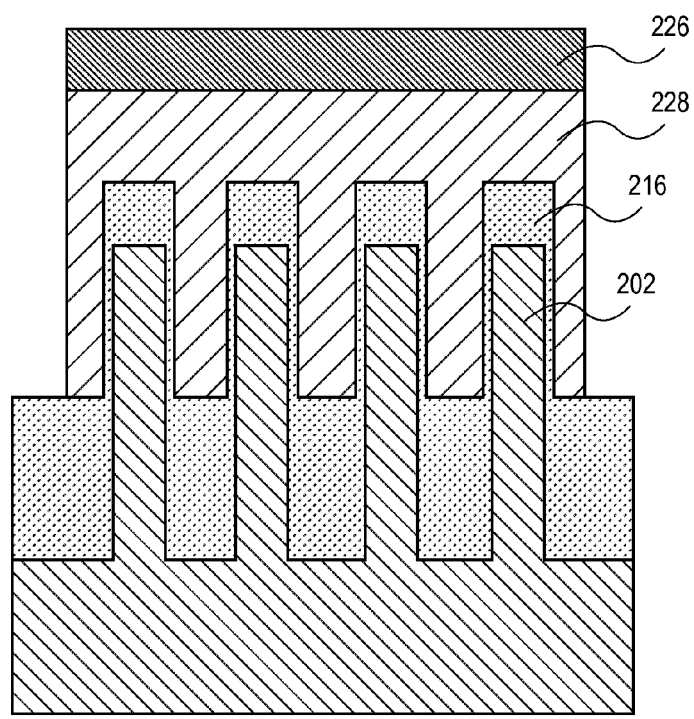

Referring to FIG. 2H, the hardmask 224 and planar gate forming layer 222 are patterned to a desired gate geometry to form patterned hardmask 226 and patterned gate forming layer 228 above fins 202 and fin dielectric layer 216.

In an embodiment, poly gate patterning is represented in FIG. 2H and involves poly lithography to define the poly gate by etch of an SiN hardmask and poly subsequently. In one embodiment, a mask I formed on the hardmask 224, the mask is composed of a topographic masking portion and an anti-reflective coating (ARC) layer. In a particular such embodiment, the topographic masking portion is a carbon hardmask (CHM) layer and the anti-reflective coating layer is a silicon ARC layer. The topographic masking portion and the ARC layer may be patterned with conventional lithography and etching process techniques. In one embodiment, the mask also includes and uppermost photo-resist layer, as is known in the art, and may be patterned by conventional lithography and development processes. In a particular embodiment, the portions of the photo-resist layer exposed to the light source are removed upon developing the photo-resist layer. Thus, patterned photo-resist layer is composed of a positive photo-resist material. In a specific embodiment, the photo-resist layer is composed of a positive photo-resist material such as, but not limited to, a 248 nm resist, a 193 nm resist, a 157 nm resist, an extreme ultra violet (EUV) resist, an e-beam imprint layer, or a phenolic resin matrix with a diazonaphthoquinone sensitizer. In another particular embodiment, the portions of the photo-resist layer exposed to the light source are retained upon developing the photo-resist layer. Thus, the photo-resist layer is composed of a negative photo-resist material. In a specific embodiment, the photo-resist layer is composed of a negative photo-resist material such as, but not limited to, consisting of poly-cis-isoprene or poly-vinyl-cinnamate.

In general, referring again to FIGS. 2A-2H, in an embodiment, the approach described can be used for N-type (e.g., NMOS) or P-type (e.g., PMOS), or both, device fabrication. It is to be understood that the structures resulting from the above exemplary processing scheme, e.g., the structures from FIG. 2H, may be used in a same or similar form for subsequent processing operations to complete device fabrication, such as PMOS and NMOS device fabrication. As an example of a completed device, FIGS. 3A and 3B illustrate a cross-sectional view and a plan view (taken along the a-a' axis of the cross-sectional view), respectively, of a non-planar semiconductor device having self-aligned fins with top blocking layers, in accordance with an embodiment of the present invention.

Figure 3A:
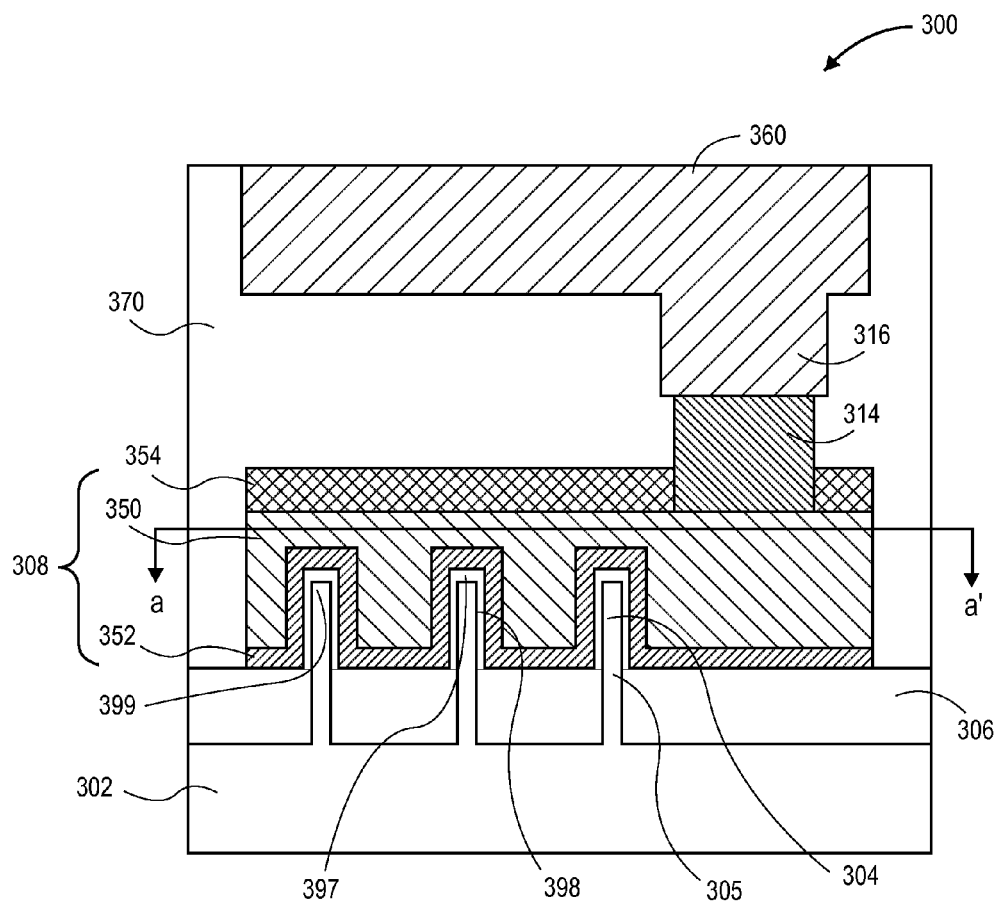
FIG. 3A illustrates a cross-sectional view of a non-planar semiconductor device having self-aligned fins with top blocking layers, in accordance with an embodiment of the present invention.

Referring to FIG. 3A, a semiconductor structure or device 300 includes a non-planar active region (e.g., a fin structure including protruding fin portion 304 and sub-fin region 305) formed from substrate 302, and within isolation region 306. A dielectric layer or blocking layer for each protruding fin portion 304 has thereon a top portion 397 thicker than a side portion 398, as depicted. In one such embodiment, the top portion 397 is sufficiently thick to mitigate or eliminate control of the fin from the portion of a gate electrode that is above the top portion 397, e.g., to enable fin-FET formation instead of trigate formation. In one embodiment, only the top portion 397 is present, and side portions 398 are removed. In an embodiment, the upper portions of each protruding fin portion 304 include as an artifact an implant region 399, e.g., an F or Ar, or both region remaining from an implant and thermal oxidation process as described above in association with FIGS. 2B and 2D.

Referring again to FIG. 3A, a gate line 308 is disposed over the protruding portions 304 of the non-planar active region as well as over a portion of the isolation region 306. As shown, gate line 308 includes a gate electrode 350 and a gate dielectric layer 352. In one embodiment, gate line 308 may also include a dielectric cap layer 354. A gate contact 314, and overlying gate contact via 316 are also seen from this perspective, along with an overlying metal interconnect 360, all of which are disposed in inter-layer dielectric stacks or layers 370. Also seen from the perspective of FIG. 3A, the gate contact 314 is, in one embodiment, disposed over isolation region 306, but not over the non-planar active regions.

Figure 3B:
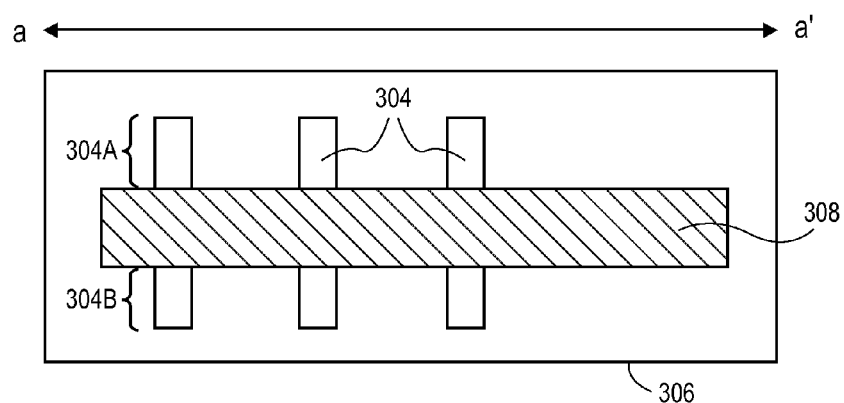
FIG. 3B illustrates a plan view taken along the a-a' axis of the semiconductor device of FIG. 3A, in accordance with an embodiment of the present invention.

Referring to FIG. 3B, the gate line 308 is shown as disposed over the protruding fin portions 304. Source and drain regions 304A and 304B of the protruding fin portions 304 can be seen from this perspective. It is to be understood that, in an embodiment, a blocking layer for each protruding fin portion 304 (e.g., the top portion 397 and the side portion 398) are removed from the source and drain regions 304A and 304B of the fins. In one embodiment, the source and drain regions 304A and 304B are doped portions of original material of the protruding fin portions 304. In another embodiment, the material of the protruding fin portions 304 is removed and replaced with another semiconductor material, e.g., by epitaxial deposition. In either case, the source and drain regions 304A and 304B may extend below the height of dielectric layer 306, i.e., into the sub-fin region 305. Alternatively, the source and drain regions 304A and 304B do not extend below the height of dielectric layer 306, and are either above or co-planar with the height of dielectric layer 306.

In an embodiment, the semiconductor structure or device 300 is a non-planar device such as, but not limited to, a fin-FET. However, a tri-gate or similar device may also be fabricated. In such an embodiment, a corresponding semiconducting channel region is composed of or is formed in a three-dimensional body. In one such embodiment, the gate electrode stacks of gate lines 308 surround at least a top surface and a pair of sidewalls of the three-dimensional body, as depicted in FIG. 3A.

Substrate 302 may be composed of a semiconductor material that can withstand a manufacturing process and in which charge can migrate. In an embodiment, substrate 302 is a bulk substrate composed of a crystalline silicon, silicon/germanium or germanium layer doped with a charge carrier, such as but not limited to phosphorus, arsenic, boron or a combination thereof, to form active region 304. In one embodiment, the concentration of silicon atoms in bulk substrate 302 is greater than 97%. In another embodiment, bulk substrate 302 is composed of an epitaxial layer grown atop a distinct crystalline substrate, e.g. a silicon epitaxial layer grown atop a boron-doped bulk silicon mono-crystalline substrate. Bulk substrate 302 may alternatively be composed of a group III-V material. In an embodiment, bulk substrate 302 is composed of a III-V material such as, but not limited to, gallium nitride, gallium phosphide, gallium arsenide, indium phosphide, indium antimonide, indium gallium arsenide, aluminum gallium arsenide, indium gallium phosphide, or a combination thereof. In one embodiment, bulk substrate 302 is composed of a III-V material and the charge-carrier dopant impurity atoms are ones such as, but not limited to, carbon, silicon, germanium, oxygen, sulfur, selenium or tellurium. Alternatively, in place of a bulk substrate, a silicon-on-insulator (SOI) substrate may be used.

Isolation region 306 may be composed of a material suitable to ultimately electrically isolate, or contribute to the isolation of, portions of a permanent gate structure from an underlying bulk substrate or isolate active regions formed within an underlying bulk substrate, such as isolating fin active regions. For example, in one embodiment, the isolation region 306 is composed of a dielectric material such as, but not limited to, silicon dioxide, silicon oxy-nitride, silicon nitride, or carbon-doped silicon nitride.

Gate line 308 may be composed of a gate electrode stack which includes a gate dielectric layer 352 and a gate electrode layer 350. In an embodiment, the gate electrode of the gate electrode stack is composed of a metal gate and the gate dielectric layer is composed of a high-K material. For example, in one embodiment, the gate dielectric layer is composed of a material such as, but not limited to, hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. Furthermore, a portion of gate dielectric layer may include a layer of native oxide formed from the top few layers of the substrate 302, e.g., in the case that the sidewall portion 397 of the blocking layer is removed. In an embodiment, the gate dielectric layer is composed of a top high-k portion and a lower portion composed of an oxide of a semiconductor material. In one embodiment, the gate dielectric layer is composed of a top portion of hafnium oxide and a bottom portion of silicon dioxide or silicon oxy-nitride.

In one embodiment, the gate electrode is composed of a metal layer such as, but not limited to, metal nitrides, metal carbides, metal silicides, metal aluminides, hafnium, zirconium, titanium, tantalum, aluminum, ruthenium, palladium, platinum, cobalt, nickel or conductive metal oxides. In a specific embodiment, the gate electrode is composed of a non-workfunction-setting fill material formed above a metal workfunction-setting layer.

Spacers associated with the gate electrode stacks (not shown) may be composed of a material suitable to ultimately electrically isolate, or contribute to the isolation of, a permanent gate structure from adjacent conductive contacts, such as self-aligned contacts. For example, in one embodiment, the spacers are composed of a dielectric material such as, but not limited to, silicon dioxide, silicon oxy-nitride, silicon nitride, or carbon-doped silicon nitride.

Gate contact 314 and overlying gate contact via 316 may be composed of a conductive material. In an embodiment, one or more of the contacts or vias are composed of a metal species. The metal species may be a pure metal, such as tungsten, nickel, or cobalt, or may be an alloy such as a metal-metal alloy or a metal-semiconductor alloy (e.g., such as a silicide material).

In an embodiment (although not shown), providing structure 300 involves formation of a contact pattern which is essentially perfectly aligned to an existing gate pattern while eliminating the use of a lithographic step with exceedingly tight registration budget. In one such embodiment, this approach enables the use of intrinsically highly selective wet etching (e.g., versus conventionally implemented dry or plasma etching) to generate contact openings. In an embodiment, a contact pattern is formed by utilizing an existing gate pattern in combination with a contact plug lithography operation. In one such embodiment, the approach enables elimination of the need for an otherwise critical lithography operation to generate a contact pattern, as used in conventional approaches. In an embodiment, a trench contact grid is not separately patterned, but is rather formed between poly (gate) lines. For example, in one such embodiment, a trench contact grid is formed subsequent to gate grating patterning but prior to gate grating cuts.

Furthermore, the gate stack structure 308 may be fabricated by a replacement gate process. In such a scheme, dummy gate material such as polysilicon or silicon nitride pillar material, may be removed and replaced with permanent gate electrode material. In one such embodiment, a permanent gate dielectric layer is also formed in this process, as opposed to being carried through from earlier processing. In an embodiment, dummy gates are removed by a dry etch or wet etch process. In one embodiment, dummy gates are composed of polycrystalline silicon or amorphous silicon and are removed with a dry etch process including use of $SF_6$. In another embodiment, dummy gates are composed of polycrystalline silicon or amorphous silicon and are removed with a wet etch process including use of aqueous $NH_4OH$ or tetramethylammonium hydroxide. In one embodiment, dummy gates are composed of silicon nitride and are removed with a wet etch including aqueous phosphoric acid.

In an embodiment, one or more approaches described herein contemplate essentially a dummy and replacement gate process in combination with a dummy and replacement contact process to arrive at structure 300. In one such embodiment, the replacement contact process is performed after the replacement gate process to allow high temperature anneal of at least a portion of the permanent gate stack. For example, in a specific such embodiment, an anneal of at least a portion of the permanent gate structures, e.g., after a gate dielectric layer is formed, is performed at a temperature greater than approximately 600 degrees Celsius. The anneal is performed prior to formation of the permanent contacts. In an embodiment, the portions 397 and 398 of the blocking layer under the gate line 308 are thinned during the replacement gate process. For example, in one embodiment, the portions 397 and 398 of the blocking layer are thinned sufficiently (e.g., by HF wet etching following dummy gate removal) to remove side portions 398 but to retain an amount of top portion 397 to block gate control from above the fins. In another embodiment, such thinning is performed prior to dummy gate formation. In another embodiment, essentially no thinning is performed at all.

Referring again to FIG. 3A, the arrangement of semiconductor structure or device 300 places the gate contact over isolation regions. Such an arrangement may be viewed as inefficient use of layout space. In another embodiment, however, a semiconductor device has contact structures that contact portions of a gate electrode formed over an active region. In general, prior to (e.g., in addition to) forming a gate contact structure (such as a via) over an active portion of a gate and in a same layer as a trench contact via, one or more embodiments of the present invention include first using a gate aligned trench contact process. Such a process may be implemented to form trench contact structures for semiconductor structure fabrication, e.g., for integrated circuit fabrication. In an embodiment, a trench contact pattern is formed as aligned to an existing gate pattern. By contrast, conventional approaches typically involve an additional lithography process with tight registration of a lithographic contact pattern to an existing gate pattern in combination with selective contact etches. For example, a conventional process may include patterning of a poly (gate) grid with separate patterning of contact features.

It is to be understood that not all aspects of the processes described above need be practiced to fall within the spirit and scope of embodiments of the present invention. For example, in one embodiment, dummy gates need not ever be formed prior to fabricating gate contacts over active portions of the gate stacks. The gate stacks described above may actually be permanent gate stacks as initially formed. Also, the processes described herein may be used to fabricate one or a plurality of semiconductor devices. The semiconductor devices may be transistors or like devices. For example, in an embodiment, the semiconductor devices are a metal-oxide semiconductor field effect transistors (MOS) transistors for logic or memory, or are bipolar transistors. Also, in an embodiment, the semiconductor devices have a three-dimensional architecture, such as a fin-FET device, a trigate device, or an independently accessed double gate device. One or more embodiments may be particularly useful for fabricating semiconductor devices at a 14 nanometer (14 nm) or smaller technology node. One or more embodiments may be particularly useful for devices included in a system-on-chip (SoC) product.

Overall, one or more embodiments of the present invention exploit an enhanced thermal oxidation with highly F- or Ar-doped silicon and is utilized to achieve fabricate fin-FET devices in an economically sound process solution. In an embodiment, such an approach can be implemented in a CMOS manufacturing process for improved transistor device performance. Differences with conventional fin-FET formation may be evident in the final structure where a top blocking dielectric of a fin is conventionally composed of silicon nitride, whereas a top blocking dielectric of a fin for one or more embodiments herein is composed of a thermal oxide, such as a thermal silicon oxide. It is to be understood that while the above description focuses primarily on bulk type devices (e.g., where fins are physically and electrically coupled with an underlying semiconductor substrate), silicon-on-insulator (SOI) type devices are also contemplated within the spirit and scope of embodiments of the present invention. For example, in one such embodiment, a plurality of semiconductor fins are patterned on an insulating layer such as a buried oxide (Box) layer. A dielectric layer such as an oxide layer is formed above the fins and then planarized to expose the top portions of the fins. Processes such as those described above are then performed on the exposed surfaces of the fins. Then, the dielectric layer is removed, possibly re-exposing the Box layer.

Figure 4:
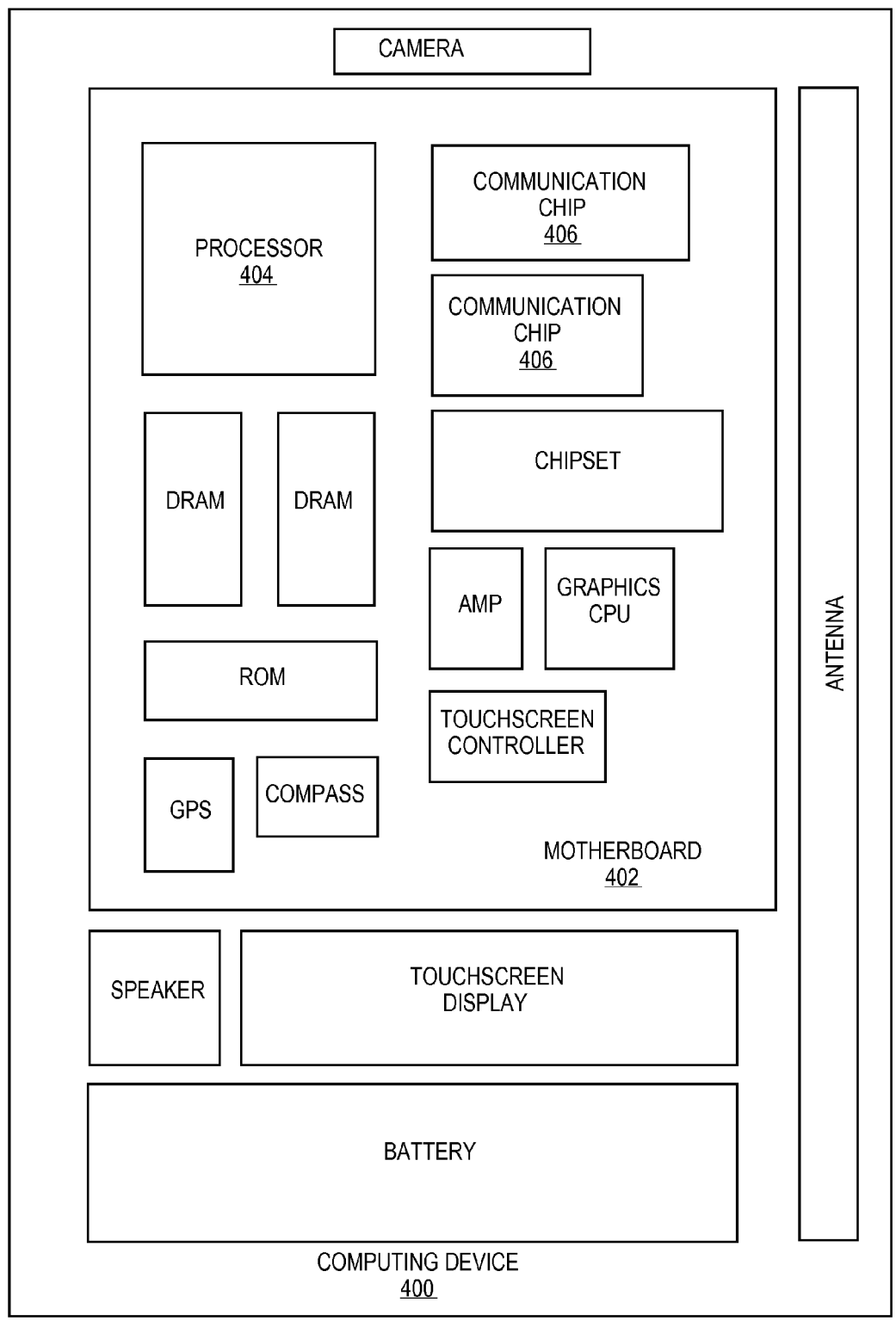
FIG. 4 illustrates a computing device in accordance with one implementation of the invention.

FIG. 4 illustrates a computing device 400 in accordance with one implementation of the invention. The computing device 400 houses a board 402. The board 402 may include a number of components, including but not limited to a processor 404 and at least one communication chip 406. The processor 404 is physically and electrically coupled to the board 402. In some implementations the at least one communication chip 406 is also physically and electrically coupled to the board 402. In further implementations, the communication chip 406 is part of the processor 404.

Depending on its applications, computing device 400 may include other components that may or may not be physically and electrically coupled to the board 402. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 406 enables wireless communications for the transfer of data to and from the computing device 400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 406 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 400 may include a plurality of communication chips 406. For instance, a first communication chip 406 may be dedicated to shorter range wireless communications such as Wi-Fi and Bluetooth and a second communication chip 406 may be dedicated to longer range wireless communications such as GPS, EDGE, GPRS, CDMA, WiMAX, LTE, Ev-DO, and others.

The processor 404 of the computing device 400 includes an integrated circuit die packaged within the processor 404. In some implementations of embodiments of the invention, the integrated circuit die of the processor includes one or more devices, such as MOS-FET transistors built in accordance with implementations of the invention. The term "processor" may refer to any device or portion of a device that processes electronic data from registers and/or memory to transform that electronic data into other electronic data that may be stored in registers and/or memory.

The communication chip 406 also includes an integrated circuit die packaged within the communication chip 406. In accordance with another implementation of the invention, the integrated circuit die of the communication chip includes one or more devices, such as MOS-FET transistors built in accordance with implementations of the invention.

In further implementations, another component housed within the computing device 400 may contain an integrated circuit die that includes one or more devices, such as MOS-FET transistors built in accordance with implementations of embodiments of the invention.

In various embodiments, the computing device 400 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 400 may be any other electronic device that processes data.

Thus, embodiments of the present invention include non-planar semiconductor devices having self-aligned fins with top blocking layers and methods of fabricating non-planar semiconductor devices having self-aligned fins with top blocking layers.

In an embodiment, a semiconductor structure includes a semiconductor fin disposed above a semiconductor substrate and having a top surface. An isolation layer is disposed on either side of the semiconductor fin, and recessed below the top surface of the semiconductor fin to provide a protruding portion of the semiconductor fin. The protruding portion has sidewalls and the top surface. A gate blocking layer has a first portion disposed on at least a portion of the top surface of the semiconductor fin, and has a second portion disposed on at least a portion of the sidewalls of the semiconductor fin. The first portion of the gate blocking layer is continuous with, but thicker than, the second portion of the gate blocking layer. A gate stack is disposed on the first and second portions of the gate blocking layer.

In one embodiment, the first portion of the gate blocking layer has a thickness greater than the second portion of the gate blocking layer by an amount approximately in the range of 10-50%.

In one embodiment, the protruding portion of the semiconductor fin further includes a region of fluorine (F) atoms or argon (Ar) atoms, or both, at an uppermost portion, but not in the entirety of, the protruding portion of the semiconductor fin, and the first portion of the gate blocking layer is directly adjacent to the region of F atoms or argon Ar atoms.

In one embodiment, the region of F or argon Ar atoms has a concentration of F atoms or Ar atoms, or both approximately in the range of 1e19-1e21 atoms/$cm^3$.

In one embodiment, the semiconductor fin is composed of single crystalline silicon, and the gate blocking layer is composed of silicon dioxide.

In one embodiment, the gate stack is composed of a high-k gate dielectric layer and metal gate electrode.

In one embodiment, the semiconductor structure further includes source and drain regions disposed in the semiconductor fin, on either side of the gate stack.

In one embodiment, the gate blocking layer is not disposed on portions of the top surface of the sidewalls of the semiconductor fin having the source and drain regions disposed therein.

In one embodiment, the semiconductor structure is a fin-FET device.

In one embodiment, the semiconductor fin disposed above the semiconductor substrate is a single crystalline fin continuous with a bulk single crystalline substrate.

In one embodiment, the first portion of the gate blocking layer has a thickness sufficient to substantially impede electrical control of the semiconductor fin by the gate stack from above the semiconductor fin.

In an embodiment, a semiconductor structure includes a semiconductor fin disposed above a semiconductor substrate and having a top surface. An isolation layer is disposed on either side of the semiconductor fin, and recessed below the top surface of the semiconductor fin to provide a protruding portion of the semiconductor fin. The protruding portion has sidewalls and the top surface and further includes a region of fluorine (F) atoms or argon (Ar) atoms, or both, at an uppermost portion, but not in the entirety of, the protruding portion of the semiconductor fin. A gate blocking layer is disposed on at least a portion of the top surface of the semiconductor fin, directly adjacent to the region of F atoms or argon Ar atoms. A gate stack is disposed above the gate blocking layer and along the sidewalls of the protruding portion of the semiconductor fin.

In one embodiment, the region of F or argon Ar atoms has a concentration of F atoms or Ar atoms, or both approximately in the range of 1e19-1e21 atoms/$cm^3$.

In one embodiment, the semiconductor fin is composed of single crystalline silicon, and the gate blocking layer is composed of silicon dioxide.

In one embodiment, the gate stack includes a high-k gate dielectric layer and metal gate electrode.

In one embodiment, the semiconductor structure further includes source and drain regions disposed in the semiconductor fin, on either side of the gate stack.

In one embodiment, the gate blocking layer is not disposed on portions of the top surface of the semiconductor fin having the source and drain regions disposed therein.

In one embodiment, the semiconductor structure is a fin-FET device.

In one embodiment, the semiconductor fin disposed above the semiconductor substrate is a single crystalline fin continuous with a bulk single crystalline substrate.

In one embodiment, the gate blocking layer has a thickness sufficient to substantially impede electrical control of the semiconductor fin by the gate stack from above the semiconductor fin.

In an embodiment, a method of fabricating a semiconductor structure involves forming a plurality of semiconductor fins above a semiconductor substrate, each semiconductor fin having a top surface. The method also involves forming a dielectric layer between the semiconductor fins and essentially co-planar with the top surface of the semiconductor fins. The method also involves implanting an oxidation-enhancing dopant into the semiconductor fins from the top surface of the semiconductor fins. The method also involves, subsequently, recessing the dielectric layer below the top surface of the semiconductor fins to expose protruding portions of each of the semiconductor fins. The method also involves thermally oxidizing the protruding portions of each of the semiconductor fins.

In one embodiment, implanting the oxidation-enhancing dopant into the semiconductor fins involves implanting fluorine (F) atoms or argon (Ar) atoms, or both.

In one embodiment, the implanting is performed with an energy approximately in the range of 1-15 keV and a dose approximately in the range of 1e14-1e16 atoms/cm$^2$.

In one embodiment, thermally oxidizing the protruding portions of each of the semiconductor fins forms a first portion of a blocking dielectric layer on top of each of the protruding portions of the semiconductor fins and a second portion of the blocking dielectric layer on sidewalls of each of the protruding portions of the semiconductor fins, the first portion thicker than the second portion.

In one embodiment, thermally oxidizing the protruding portions of each of the semiconductor fins involves heating in the presence of oxygen at a temperature approximately in the range of 500-800 degrees Celsius.

What is claimed is:

1. A semiconductor structure, comprising:
   a semiconductor fin disposed above a semiconductor substrate and having a top surface;
   an isolation layer disposed on either side of the semiconductor fin, and recessed below the top surface of the semiconductor fin to provide a protruding portion of the semiconductor fin, the protruding portion having sidewalls and the top surface;
   a gate blocking layer having a first portion in direct contact with at least a portion of the top surface of the semiconductor fin, and having a second portion disposed on at least a portion of the sidewalls of the semiconductor fin, the first portion of the gate blocking layer continuous with the second portion of the gate blocking layer, wherein the first portion of the gate blocking layer has a vertical thickness greater than a horizontal thickness of the second portion of the gate blocking layer; and
   a gate stack disposed on the first and second portions of the gate blocking layer.

2. The semiconductor structure of claim 1, wherein the vertical thickness of the first portion of the gate blocking layer is greater than the horizontal thickness of the second portion of the gate blocking layer by an amount approximately in the range of 10-50%.

3. The semiconductor structure of claim 1, wherein the protruding portion of the semiconductor fin further comprises a region of fluorine (F) atoms or argon (Ar) atoms, or both, at an uppermost portion, but not in the entirety of, the protruding portion of the semiconductor fin, and wherein the first portion of the gate blocking layer is directly adjacent to the region of F atoms or argon Ar atoms.

4. The semiconductor structure of claim 3, wherein the region of F or argon Ar atoms has a concentration of F atoms or Ar atoms, or both approximately in the range of 1e19-1e21 atoms/cm$^3$.

5. The semiconductor structure of claim 1, wherein the semiconductor fin comprises single crystalline silicon, and the gate blocking layer comprises silicon dioxide.

6. The semiconductor structure of claim 1, wherein the gate stack comprises a high-k gate dielectric layer and metal gate electrode.

7. The semiconductor structure of claim 1, further comprising:
   source and drain regions disposed in the semiconductor fin, on either side of the gate stack.

8. The semiconductor structure of claim 7, wherein the gate blocking layer is not disposed on portions of the top surface of the sidewalls of the semiconductor fin having the source and drain regions disposed therein.

9. The semiconductor structure of claim 7, wherein the semiconductor structure is a fin-FET device.

10. The semiconductor structure of claim 1, wherein the semiconductor fin disposed above the semiconductor substrate is a single crystalline fin continuous with a bulk single crystalline substrate.

11. The semiconductor structure of claim 1, wherein the vertical thickness of the first portion of the gate blocking layer is sufficient to substantially impede electrical control of the semiconductor fin by the gate stack from above the semiconductor fin.

12. A semiconductor structure, comprising:
    a semiconductor fin disposed above a semiconductor substrate and having a top surface;
    an isolation layer disposed on either side of the semiconductor fin, and recessed below the top surface of the semiconductor fin to provide a protruding portion of the semiconductor fin, the protruding portion having sidewalls and the top surface and further comprising a region of fluorine (F) atoms or argon (Ar) atoms, or both, at only an uppermost portion of the protruding portion of the semiconductor fin;
    a gate blocking layer having a first portion in direct contact with at least a portion of the top surface of the semiconductor fin, and having a second portion in direct contact with at least a portion of the sidewalls of the semiconductor fin, wherein the first portion of the gate blocking layer has a vertical thickness greater than a horizontal thickness of the second portion of the gate blocking layer, directly adjacent to the region of F atoms or argon Ar atoms; and a gate stack disposed above the gate blocking layer and along the sidewalls of the protruding portion of the semiconductor fin.

13. The semiconductor structure of claim 12, wherein the region of F or argon Ar atoms has a concentration of F atoms or Ar atoms, or both approximately in the range of 1e19-1e21 atoms/cm$^3$.

14. The semiconductor structure of claim 12, wherein the semiconductor fin comprises single crystalline silicon, and the gate blocking layer comprises silicon dioxide.

15. The semiconductor structure of claim 12, wherein the gate stack comprises a high-k gate dielectric layer and metal gate electrode.

16. The semiconductor structure of claim 12, further comprising:
   source and drain regions disposed in the semiconductor fin, on either side of the gate stack.

17. The semiconductor structure of claim 16, wherein the gate blocking layer is not disposed on portions of the top surface of the semiconductor fin having the source and drain regions disposed therein.

18. The semiconductor structure of claim 16, wherein the semiconductor structure is a fin-FET device.

19. The semiconductor structure of claim 12, wherein the semiconductor fin disposed above the semiconductor substrate is a single crystalline fin continuous with a bulk single crystalline substrate.

20. The semiconductor structure of claim 12, wherein the gate blocking layer has a thickness sufficient to substantially impede electrical control of the semiconductor fin by the gate stack from above the semiconductor fin.

21. The semiconductor structure of claim 12, wherein the region of fluorine or argon atoms is a region of fluorine atoms.

22. The semiconductor structure of claim 12, wherein the region of fluorine or argon atoms is a region of argon atoms.

* * * * *